United States Patent
Otani et al.

[11] Patent Number: 5,864,063
[45] Date of Patent: Jan. 26, 1999

[54] ELECTROSTATIC CAPACITY-TYPE ACCELERATION SENSOR

[75] Inventors: Hiroshi Otani; Yasuo Yamaguchi, both of Tokyo, Japan

[73] Assignee: Mitsubishi Denki Kabushiki Kaisha, Tokyo, Japan

[21] Appl. No.: 806,612

[22] Filed: Feb. 26, 1997

[30] Foreign Application Priority Data

Sep. 12, 1996 [JP] Japan .................................. 8-241680

[51] Int. Cl.⁶ .................................................. G01P 15/125
[52] U.S. Cl. ........................................................ 73/514.32
[58] Field of Search .......................... 73/514.16, 514.32, 73/514.35, 514.36, 514.17, 514.18, 514.01, 514.21, 774, 780; 361/280, 283.2, 283.3, 290; 257/417, 415

[56] References Cited

U.S. PATENT DOCUMENTS

| | | | |
|---|---|---|---|
| 5,303,589 | 4/1994 | Reidemeister et al. | 73/514.36 |
| 5,345,823 | 9/1994 | Reidemeister et al. | 73/514.32 |
| 5,373,739 | 12/1994 | Azetsu et al. | 73/514.36 |
| 5,379,640 | 1/1995 | Yamamoto | 73/514.36 |
| 5,410,915 | 5/1995 | Yamamoto | 73/514.32 |
| 5,415,044 | 5/1995 | Yamamoto | 73/514.36 |
| 5,460,044 | 10/1995 | Yamamoto | 73/514.16 |
| 5,616,844 | 4/1997 | Suzuki et al. | 73/514.32 |
| 5,656,776 | 8/1997 | Otani | 73/493 |
| 5,665,914 | 9/1997 | Yamamoto | 73/514.16 |
| 5,676,851 | 10/1997 | Suzuki et al. | 216/2 |
| 5,686,711 | 11/1997 | Yamamoto | 200/61.48 |
| 5,734,106 | 3/1998 | Caillat | 73/514.01 |
| 5,760,455 | 6/1998 | Hierold et al. | 257/415 |

FOREIGN PATENT DOCUMENTS

| | | | |
|---|---|---|---|
| 3-94169 | 4/1991 | Japan | G01P 15/125 |
| 5-136331 | 6/1993 | Japan | H01L 25/065 |
| 7-209328 | 5/1995 | Japan | G01P 15/125 |
| 7-209328 | 8/1995 | Japan | G01P 15/125 |

*Primary Examiner*—Hezron Williams
*Assistant Examiner*—Richard A. Moller

[57] ABSTRACT

An enplane displacement, electrostatic capacity-type acceleration sensor includes a sensor unit made from a silicon substrate having a displaceable electrode and a fixed electrode, a pair of protective substrates bonded on opposing sides of the sensor unit, and an integrated circuit for detecting acceleration from the electrostatic capacity of the sensor unit. Sensor unit connection electrodes formed for connecting the sensor unit with the integrated circuit are disposed on the side of the sensor unit facing one of the protective substrates. Electrode holes are disposed in one protective substrate which are formed as through-holes in the substrate at positions corresponding to the connection electrodes. The integrated circuit is connected to the protective substrate in which the electrode holes are formed with the connections of the integrated circuit inserted through the electrode holes and electrically connected with the connection electrodes of the sensor unit.

16 Claims, 5 Drawing Sheets

ELECTROSTATIC CAPACITY-TYPE ACCELERATION SENSOR

BACKGROUND OF THE INVENTION

1. Field of the Invention

The present invention relates to an inertial force sensor for detecting the acceleration and angular velocity acting on a displaceable object, and relates particularly to an electrostatic capacity-type acceleration sensor that electrically detects the acceleration from the capacitance change of a capacitor.

2. Description of the Prior Art

An electrostatic capacity-type acceleration sensor comprises an immobile fixed electrode and a displaceable electrode that is displaced by an inertial force of acceleration. Because the dielectric constant between the fixed electrode and displaceable electrode is constant, the electrode distance between the fixed electrode and displaceable electrode changes with the displacement of the displaceable electrode, and the capacitance of the capacitor formed by a dielectric body between the fixed electrode and displaceable electrode changes. This capacitance change makes it possible to detect acceleration by detecting the capacitance change using a detection circuit.

The detection circuit for detecting acceleration using an electrostatic capacity-type acceleration sensor as described above is typically made from an application-specific integrated circuit (ASIC) or other integrated circuit (IC) separately from the electrostatic capacity-type acceleration sensor. However, the capacitance change caused by an inertial force of acceleration in this electrostatic capacity-type acceleration sensor is small, and the detection circuit must therefore detect acceleration from this small change in capacitance. The electrostatic capacity-type acceleration sensor and detection circuit are also connected through the wiring pattern of the circuit board and the detection result is therefore affected by the parasitic capacitance of the wiring pattern. This makes it difficult for the detection circuit to accurately detect the capacitance of the electrostatic capacity-type acceleration sensor.

SUMMARY OF THE INVENTION

An object of the present invention is therefore to resolve the above problems by achieving an electrostatic capacity-type acceleration sensor in which the effects of the parasitic capacitance of the wiring connecting the electrostatic capacity-type acceleration sensor with the detection circuit is reduced, thereby enabling the acceleration to be accurately detected.

To achieve the above object, an electrostatic capacity-type acceleration sensor according to the present invention is an electrostatic capacity-type acceleration sensor that uses enplane displacement to detect acceleration from the electrostatic capacity between a fixed electrode and a displaceable electrode that is displaced by an inertial force of acceleration by means of a sensor unit made from a silicon substrate and comprising a displaceable electrode and a fixed electrode, a pair of protective substrates bonded on opposing sides of the sensor unit, and an integrated circuit for detecting an acceleration from a change in the electrostatic capacity of the sensor unit. The connection electrodes of the sensor unit formed for connecting the sensor unit with the integrated circuit are disposed on the side of the sensor unit facing one of the protective substrates, electrode holes are disposed in said one protective substrate by providing through-holes in the substrate at positions corresponding to the connection electrodes, and the integrated circuit is bonded to the protective substrate in which said electrode holes are formed with the connector pins of the integrated circuit inserted to said electrode holes and electrically connected with the connection electrodes of the sensor unit.

An electrostatic capacity-type acceleration sensor according to an aspect of the present invention is further characterized by the integrated circuit and connection electrodes being connected by bonding with lead wires.

An electrostatic capacity-type acceleration sensor according to another aspect of the present invention is further characterized by bumps being disposed at positions corresponding to each of the electrode holes in the surface of the integrated circuit that bonds to the protective substrate, each of the electrode holes being filled with a conductive material, and each of the bumps being electrically connected to the conductive material in the corresponding electrode hole.

An electrostatic capacity-type acceleration sensor according to one more aspect of the present invention is further characterized by lead wires bonded to the integrated circuit on the surface thereof that adheres to the protective substrate at positions corresponding to each of the electrode holes, each of the electrode holes being filled with a conductive material, and each of the bonded lead wires being electrically connected to the conductive material in the corresponding electrode holes.

An electrostatic capacity-type acceleration sensor according to a further aspect of the present invention is further characterized by each of the bonded lead wires being cut to a length less than the thickness of the protective substrate in which the electrode holes are formed, inserted to the corresponding electrode hole, and electrically connected by fusing with the conductive material.

An electrostatic capacity-type acceleration sensor according to one other aspect of the present invention is further characterized by the integrated circuit being bonded to the protective substrate in which the electrode holes are formed using a low stress resin.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.
Embodiment 1

Figure 1:
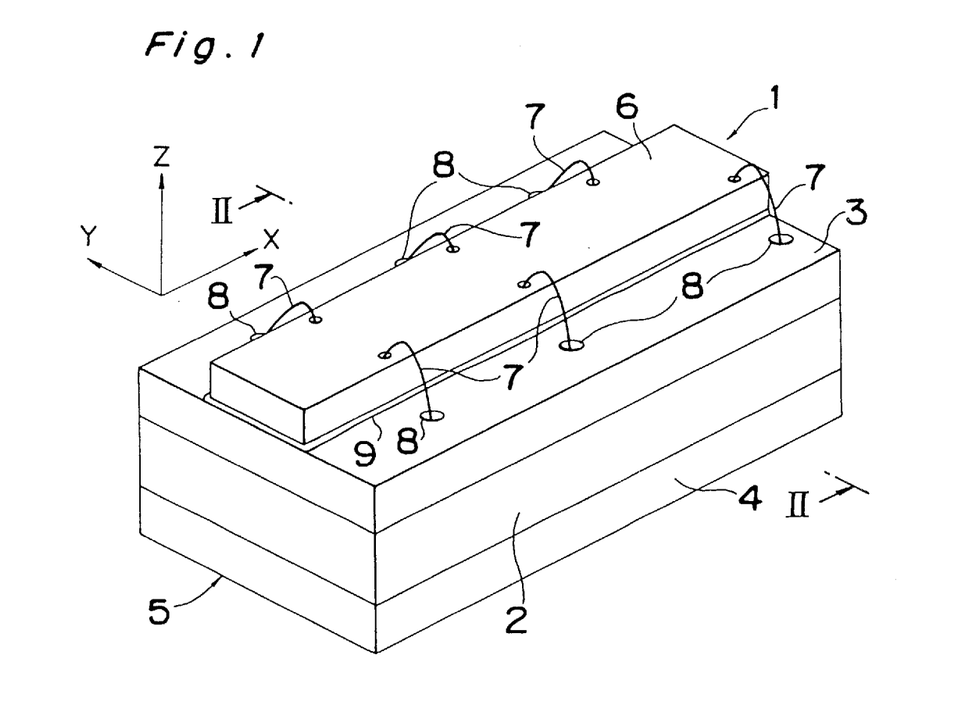
FIG. 1 is an oblique view of an enplane displacement, electrostatic capacity-type acceleration sensor according to a first embodiment of the present invention.

FIG. 1 is an oblique view of an enplane displacement, electrostatic capacity-type acceleration sensor according to a first embodiment of the present invention.

As shown in FIG. 1, the electrostatic capacity-type acceleration sensor 1 comprises a sensor element 5 made from a sensor unit 2 and a pair of substrates 3 and 4 disposed on opposing sides of the sensor unit 2, and an integrated circuit (IC) 6 bonded to the top of the one substrate 3.

The sensor unit 2 is made from a silicon substrate and expresses as a change in electrostatic capacity the inertial force of acceleration. The substrates 3 and 4 are made from a material such as aluminosilicate or borosilicate glass having a linear expansion coefficient close to that of silicon. The IC 6 comprises a detection circuit for detecting acceleration from the change in the electrostatic capacity of the sensor unit 2.

Electrode holes 8, which are through-holes for connecting the IC 6 with the various electrodes of the sensor unit 2 by means of lead wires 7 or other bonding wires, are also provided in the substrate 3. The IC 6 is bonded to the substrate 3 by means of an adhesive material 9.

Figure 2:
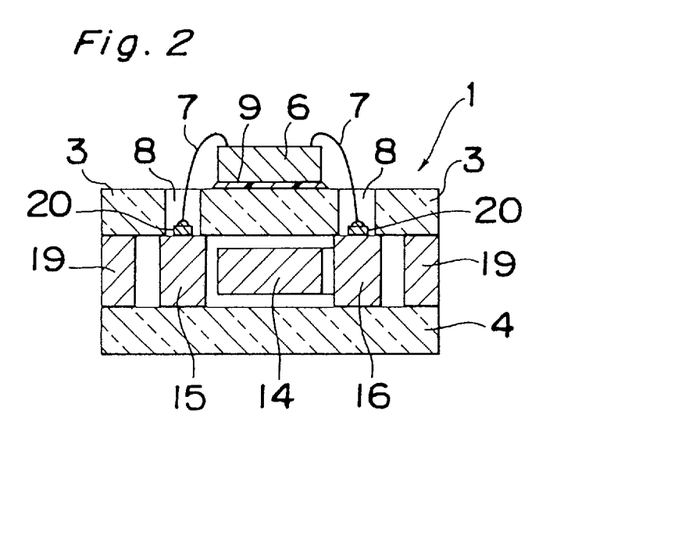
FIG. 2 is a cross section through line II—II in the electrostatic capacity-type acceleration sensor 1 shown in FIG. 1.
Figure 3:
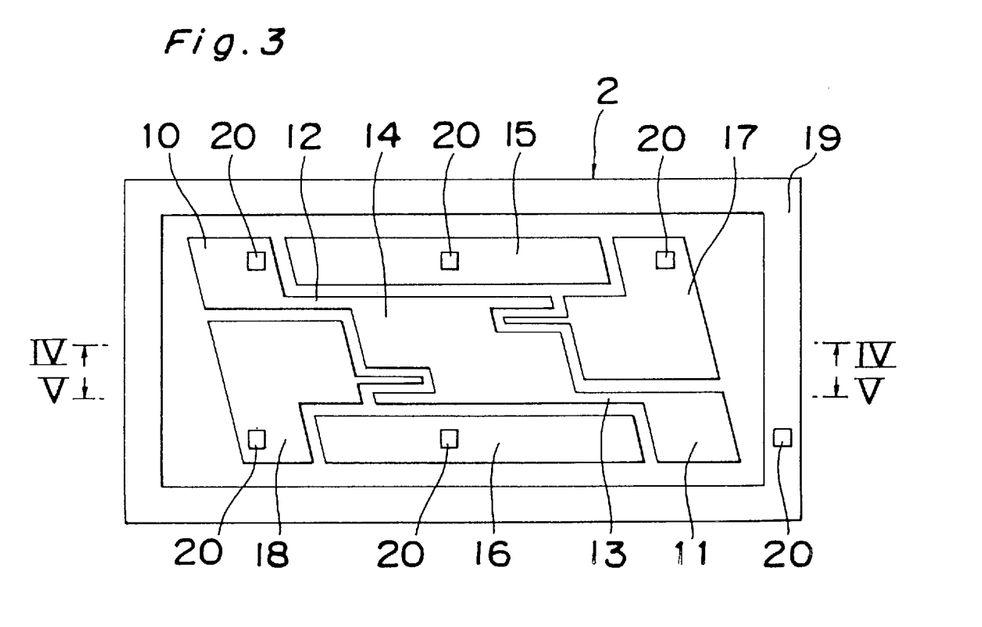
FIG. 3 is a plan view of the structure of the sensor unit 2 with the substrate 3 removed.
Figure 4:
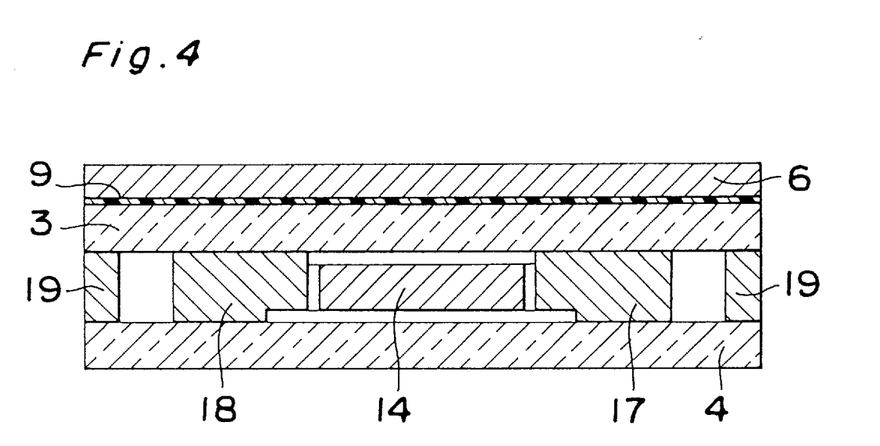
FIG. 4 is a cross section of the electrostatic capacity-type acceleration sensor 1 through line IV—IV in FIG. 3.
Figure 5:
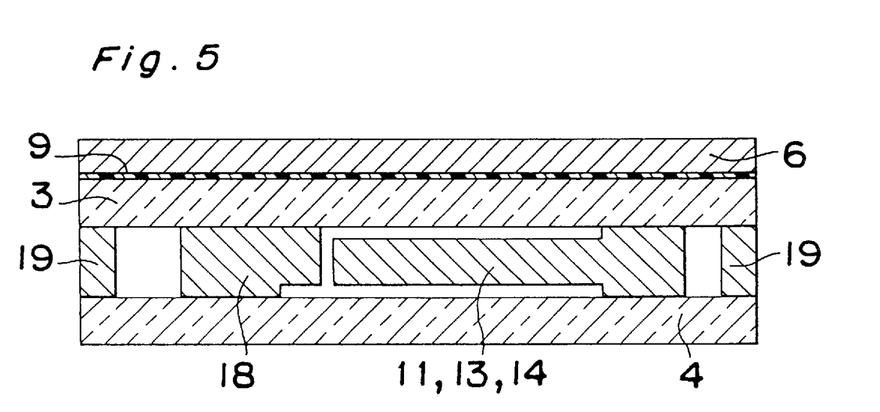
FIG. 5 is a cross section of the electrostatic capacity-type acceleration sensor 1 through line V—V in FIG. 3.

The internal structure of the electrostatic capacity-type acceleration sensor 1 shown in FIG. 1 is shown by way of example only in FIG. 2 to FIG. 5. FIG. 2 is a cross section through line II—II in the electrostatic capacity-type acceleration sensor 1 shown in FIG. 1. FIG. 3 is a plan view of the structure of the sensor unit 2 with the substrate 3 removed. FIG. 4 is a cross section of the electrostatic capacity-type acceleration sensor 1 through line IV—IV in FIG. 3. FIG. 5 is a cross section of the electrostatic capacity-type acceleration sensor 1 through line V—V in FIG. 3.

As shown in FIGS. 2 to 5, the sensor unit 2 comprises anchors 10 and 11 formed from the silicon substrate, cross members 12 and 13, mass 14, fixed electrodes 15 and 16, fixed detection electrodes 17 and 18, and auxiliary support 19. Connection electrodes 20 made from Cr, Au, or other material are formed on anchor 10, fixed electrodes 15 and 16, fixed detection electrodes 17 and 18, and auxiliary support 19 on the surfaces thereof contacting substrate 3.

The anchors 10 and 11, cross members 12 and 13, and mass 14 are integrally formed to constitute a vibrating body in which the mass 14 functions as a displaceable electrode. Note that the mass 14 is manufactured to displace in the Y direction referenced to the X-Y-Z axes shown in FIG. 1. The mass 14 thus displaces parallel to the silicon substrate forming the sensor unit 2. Displacement in the X or Y directions in FIG. 1 is called "enplane displacement."

The electrostatic capacity-type acceleration sensor 1 is manufactured as follows. First, a silicon device wafer pre-etched with etching channels is cathodically bonded to the substrate 4 and then anistropically etched to form the anchors 10 and 11, cross members 12 and 13, mass 14, fixed electrodes 15 and 16, fixed detection electrodes 17 and 18, and auxiliary support 19. The connection electrodes 20 are then formed at the specified positions, and the substrate 3 is cathodically bonded to the anchors 10 and 11, cross members 12 and 13, mass 14, fixed electrodes 15 and 16, fixed detection electrodes 17 and 18, and auxiliary support 19.

A gap of a specified dimension between the substrates 3 and 4 and the cross members 12 and 13 and mass 14 is formed by etching. The mass 14 can thus be displaced by means of cross members 12 and 13 in the directions of fixed electrodes 15 and 16 by pivoting on the anchors 10 and 11. Anchors 10 and 11, fixed electrodes 15 and 16, fixed detection electrodes 17 and 18, and auxiliary support 19 are cathodically bonded between the substrates 3 and 4.

The IC 6 is then fastened by adhesion to a particular position on top of the substrate 3 using a resin, solder, silver paste, or other adhesive material 9. More specifically, if the IC 6 is bonded to the substrate 3 using a silicon resin or other low stress resin, the effect on the electrical characteristics of differences in the thermal expansion coefficients of the substrate 3 and IC 6 at low and high temperatures can be tempered.

Electrode holes 8 are also pre-opened in the substrate 3 at positions corresponding to the connection electrodes 20. The substrate 3 is bonded with the electrode holes 8 aligned with the connection electrodes 20 so that the IC 6 and the connection electrodes 20 can be connected by means of bonding wire or other lead wires 7. By grounding the connection electrodes 20 disposed to the auxiliary support 19 through the IC 6, the stray capacity can be stabilized, and the auxiliary support 19 can be used as an electrostatic shield.

When the inertial force of acceleration is then applied to an electrostatic capacity-type acceleration sensor 1 thus comprised, the mass 14 pivoting on the anchors 10 and 11 is displaced in the direction of fixed electrode 15 or 16 by means of the cross members 12 and 13. This produces a difference in the electrostatic capacity of the capacitor formed between the fixed electrode 15 and the mass 14, and the electrostatic capacity of the capacitor formed between the fixed electrode 16 and the mass 14. This difference in electrostatic capacity enables the IC 6 to detect the acceleration from the detection circuit difference detected through the lead wires 7 from the connection electrodes 20 disposed to the anchor 10 and fixed electrodes 15 and 16.

The fixed detection electrodes 17 and 18 are electrodes used for detection by the electrostatic capacity-type acceleration sensor. When inertial force is not applied to the electrostatic capacity-type acceleration sensor 1 and a voltage is applied from the IC 6 to the fixed detection electrodes 17 and 18 through the lead wires 7, a potential difference occurs between the electrodes and mass 14 and the mass 14 displaces as the result of electrostatic attraction.

Electrostatic attraction is apparently equal to the inertia or other external force acting on the electrostatic capacity-type acceleration sensor 1. By detecting the change in the electrostatic capacity of the capacitor formed between the fixed electrode 15 and mass 14 and the electrostatic capacity of the capacitor formed between the fixed electrode 16 and mass 14 at this time, the IC 6 is able to detect whether the mass 14 of the electrostatic capacity-type acceleration sensor 1 has actually displaced.

The electrostatic capacity-type acceleration sensor 1 according to the first embodiment of the present invention is thus able to reduce the effects of the parasitic capacitance of the wiring used to connect the IC 6 with the sensor unit 2, and accurately detect the electrostatic capacity of the sensor unit 2, by connecting the IC 6 and the sensor unit 2 with the shortest possible lead wires. This is enabled as described above by bonding the IC 6 on the substrate 3, and connecting the various connection electrodes 20 of the sensor unit 2 with the IC 6 by means of lead wires 7 inserted to the electrode holes 8 in the substrate 3.

It is therefore possible to improve the precision of an enplane displacement, electrostatic capacity-type acceleration sensor, facilitate the electrical connections of the sensor, and achieve a more compact sensor unit.

Embodiment 2

In the first embodiment of an electrostatic capacity-type acceleration sensor according to the present invention as described above the IC 6 and connection electrodes 20 of the sensor unit 2 are connected using lead wires 7. In the second embodiment of the invention described below, however, the IC 6 is connected with the connection electrodes 20 without using lead wires.

Figure 6:
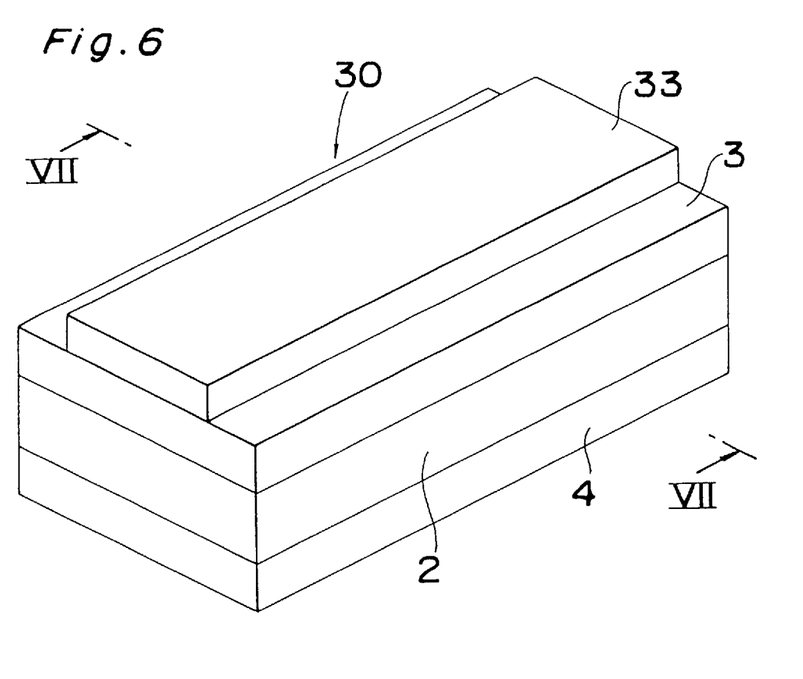
FIG. 6 is an oblique view of an enplane displacement, electrostatic capacity-type acceleration sensor according to the second embodiment of the invention.
Figure 7:
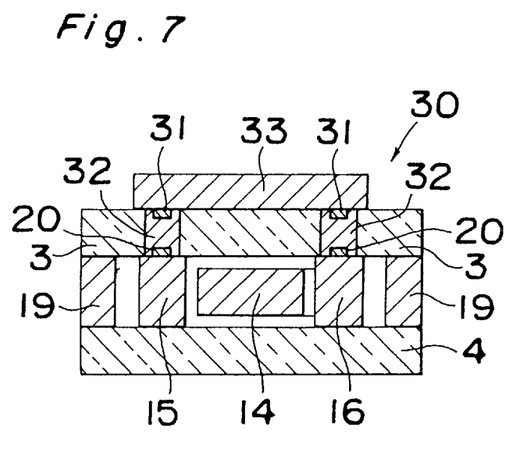
FIG. 7 is a cross sectional diagram through line VII—VII of the electrostatic capacity-type acceleration sensor shown in FIG. 6.

FIG. 6 is an oblique view of an enplane displacement, electrostatic capacity-type acceleration sensor according to the second embodiment of the invention. FIG. 7 is a cross sectional diagram through line VII—VII of the electrostatic capacity-type acceleration sensor shown in FIG. 6. Note that like parts in FIG. 6 and FIG. 7 of the second embodiment and FIG. 1 and FIG. 2 of the first embodiment are identified by like reference numbers, and further description thereof is omitted below. Only the differences between the first and second embodiments are described below.

The second embodiment in FIG. 6 and FIG. 7 differs from the first embodiment in that the lead wires 7 have been eliminated, and bumps 31 are disposed on the adhesion surface between the IC 6 and substrate 3 in FIG. 1 and FIG. 2 at positions corresponding to the connection electrodes 20 of the sensor unit 2. In addition, the electrode holes 8 in the substrate 3 are filled with a conductive material 32 to electrically connect the conductive material 32 in each of the electrode holes 8 with the corresponding bump 31. Therefore, the IC 6 and the electrostatic capacity-type acceleration sensor 1 in FIGS. 1 and 2 are identified as IC 33 and electrostatic capacity-type acceleration sensor 30 below.

Referring to FIGS. 6 and 7, the electrode holes 8 in the substrate 3 are filled with a conductive material 32 such as solder or silver paste. Solder or Au bumps 31 are also formed on the IC 33 at positions corresponding to the connection electrodes 20 of the sensor unit 2 on the adhesion face with the substrate 3. The bumps 31 and correspondingly positioned conductive, material 32 are fused together, for example, to establish an electrical connection therebetween, thereby connecting the connection electrodes 20 of the sensor unit 2 with the IC 33 and bonding the IC 33 to the substrate 3. To increase the bonding strength of the IC 33 and substrate 3 it is also possible to apply an adhesive material 9 between the IC 33 and substrate 3 in addition to the electrical connection.

Therefore, in addition to the effects achieved by the first embodiment above, the electrostatic capacity-type acceleration sensor 30 according to the second embodiment can further improve device reliability by preventing shorts between lead wires because the bonding wires and other lead wire 7 are eliminated and the IC 33 is electrically connected to the substrate 3 by means of bumps 31 disposed on the IC 33 and the conductive material 32 filled into the corresponding electrode holes 8.

Embodiment 3

While bumps 31 are provided on the IC 33 in the second embodiment above, the third embodiment bonds lead wires or other bonding wires in place of the bumps 31, and electrically connects these bonded lead wires to the conductive material 32. Note that an oblique view of the electrostatic capacity-type acceleration sensor according to the third embodiment is identical to that of the second embodiment, and the figure shown in FIG. 6 is therefore used in reference to the third embodiment below.

Figure 8:
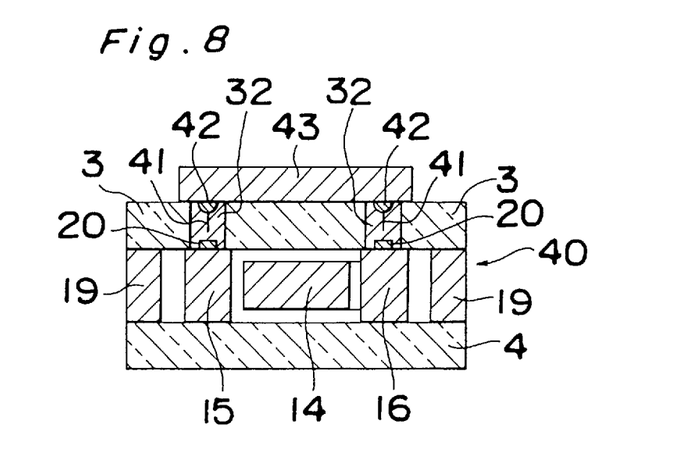
FIG. 8 is a cross sectional diagram showing the electrostatic capacity-type acceleration sensor according to a third embodiment of the present invention.

FIG. 8 is a cross sectional diagram through line VII—VII of the electrostatic capacity-type acceleration sensor shown in FIG. 6. Note that like parts in FIG. 7 and FIG. 8 are identified by like reference numbers, and further description thereof is omitted below. Only the differences between the second and third embodiments are described below.

The third embodiment in FIG. 8 differs from the second embodiment FIG. 7 in that the bumps 31 have been eliminated, and bonding wires or other lead wires 41 are bonded at the positions of said bumps 31 to form a bonding member 42. The lead wires 41 are then cut. Therefore, the IC 33 in FIG. 7 is referenced as IC 43 and the electrostatic capacity-type acceleration sensor 30 as electrostatic capacity-type acceleration sensor 40 below.

Figure 9:
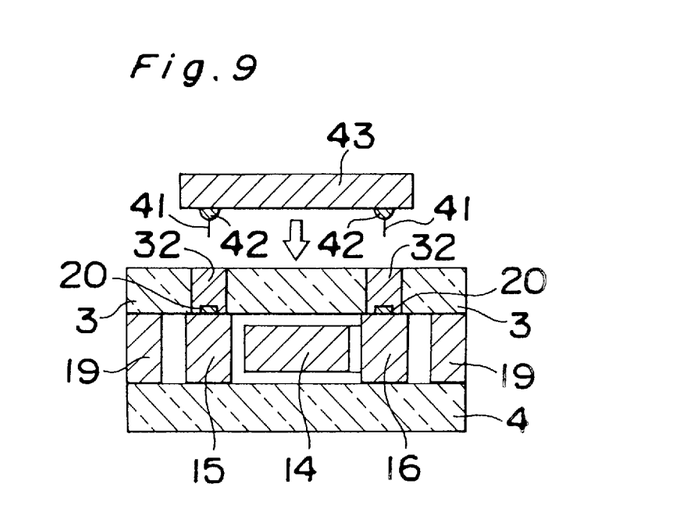
FIG. 9 is a cross sectional diagram of the IC 43 of the electrostatic capacity-type acceleration sensor 40 shown in FIG. 8 bonded to the substrate 3.

FIG. 9 is a cross sectional diagram of the IC 43 of the electrostatic capacity-type acceleration sensor 40 shown in FIG. 8 bonded to the substrate 3.

Referring to FIG. 9 lead wires 41 are bonded to the IC 43 on the surface adhering to the substrate 3 at positions corresponding to the connection electrodes 20 of the sensor unit 2 to form bonding members 42. The lead wires 41 are then cut to a length less than the thickness of the substrate 3.

In addition, the electrode holes 8 in the substrate 3 are filled with a solder, conductive adhesive, or similar conductive material 32 to electrically connect the conductive material 32 in each of the electrode holes 8 with the corresponding lead wire 41. As a result, the connection electrodes 20 of the sensor unit 2 are connected with the lead wires 41 of the IC 43, and the IC 43 is bonded to the substrate 3. To increase the bonding strength of the IC 43 and substrate 3 it is also possible to apply an adhesive material 9 between the IC 43 and substrate 3 in addition to the electrical connection.

Therefore, in addition to the effects achieved by the first embodiment above, the electrostatic capacity-type acceleration sensor 40 according to the third embodiment can further improve device reliability by preventing shorts between lead wires by fusing the lead wires 41 bonded to the IC 43 with the conductive material 32 filled into the corresponding electrode holes 8 to establish an electrical connection therebetween.

An electrostatic capacity-type acceleration sensor according to the present invention is an enplane displacement, electrostatic capacity-type acceleration sensor wherein each of the connection electrodes formed in the sensor unit for connection with the IC is provided on one of the protective substrates. Through-holes are also formed in this protective substrate at positions corresponding to the connection electrodes as electrode holes. The IC is bonded to the protective substrate in which these electrode holes are formed with the IC pins inserted to the electrode holes to establish an electrical connection with the connection electrodes of the sensor unit. The sensor unit and IC can therefore be connected with the shortest possible lead wires, the effects of parasitic capacitance from the connection wiring used to connect the sensor unit and IC can be reduced, and the electrostatic capacity of the sensor unit can be accurately detected. The precision of an enplane displacement, electrostatic capacity-type acceleration sensor can therefore be improved, electrical connections can be easily established, and the acceleration sensor can be compactly achieved.

The electrostatic capacity-type acceleration sensor according to one aspect of the present invention is an electrostatic capacity-type acceleration sensor wherein the lead wires connecting the IC and connection electrodes of the acceleration sensor are bonded together. The sensor unit and IC can therefore be connected with the shortest possible lead wires, the effects of parasitic capacitance from the connection wiring used to connect the sensor unit and IC can be reduced, and the electrostatic capacity of the sensor unit can be accurately detected. The precision of an enplane displacement, electrostatic capacity-type acceleration sensor can therefore be improved, electrical connections can be easily established, and the acceleration sensor can be compactly achieved.

The electrostatic capacity-type acceleration sensor according to another aspect of the present invention is an electrostatic capacity-type acceleration sensor wherein bumps are disposed to the IC at positions corresponding to the electrode holes in the protective substrate as a means of electrically connecting the sensor unit and IC. The electrode holes are also filled with a conductive material. The bumps are then aligned with the electrode holes, and are electrically connected with the bumps. The sensor unit and IC can therefore be connected with the shortest possible connection, the effects of parasitic capacitance from the connection wiring used to connect the sensor unit and IC can be reduced, the electrostatic capacity of the sensor unit can be accurately detected, and the possibility of shorts occurring when the sensor unit and IC are connected by bonding lead wires can be prevented. The reliability of an enplane displacement, electrostatic capacity-type acceleration sensor can therefore be improved, the detection precision can be improved and the size reduced, and electrical connections easily established.

The electrostatic capacity-type acceleration sensor according to a further aspect of the present invention is an electrostatic capacity-type acceleration sensor wherein lead wires are bonded to the surface of the IC bonded to the protective substrate at positions corresponding to the electrode holes in the protective substrate as a means of electrically connecting the sensor unit and IC. The sensor unit and IC can therefore be connected with the shortest possible connection, the effects of parasitic capacitance from the connection wiring used to connect the sensor unit and IC can be reduced, the electrostatic capacity of the sensor unit can be accurately detected, and the possibility of shorts occurring when the sensor unit and IC are connected by bonding lead wires can be prevented. The reliability of an enplane displacement, electrostatic capacity-type acceleration sensor can therefore be improved, the detection precision can be improved and the size reduced, and electrical connections easily established.

The electrostatic capacity-type acceleration sensor according to one more aspect of the present invention is an electrostatic capacity-type acceleration sensor wherein the lead wires bonded to the surface of the IC are cut to a length less than the thickness of the protective substrate, are then inserted to the electrode holes and electrically connected by fusing the lead wires with the conductive material. The sensor unit and IC can therefore be connected with the shortest possible connection, the effects of parasitic capacitance from the connection wiring used to connect the sensor unit and IC can be reduced, the electrostatic capacity of the sensor unit can be accurately detected, and the possibility of shorts occurring when the sensor unit and IC are connected by bonding lead wires can be prevented. The reliability of an enplane displacement, electrostatic capacity-type acceleration sensor can therefore be improved, the detection precision can be improved and the size reduced, and electrical connections easily established.

The electrostatic capacity-type acceleration sensor according to a further aspect of the present invention is an electrostatic capacity-type acceleration sensor wherein the IC is bonded to the protective substrate in which the electrode holes are formed using a low stress resin, thereby alleviating the effects on the electrical characteristics of the differences in the linear expansion coefficient under low and high temperatures of the protective substrate and the IC.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An enplane displacement electrostatic capacity-type acceleration sensor comprising:

a sensor unit made from a silicon substrate and comprising a displaceable electrode and a fixed electrode, said displaceable electrode displaced by inertial force of acceleration resulting in a change in electrostatic capacity between said fixed electrode and said displaceable electrode;

first and second protective substrates bonded on opposing sides of said sensor unit; and an integrated circuit for detecting acceleration from the electrostatic capacity of the sensor unit, wherein connection electrodes of said sensor unit provided for connecting said sensor unit with said integrated circuit are disposed on the side of said sensor unit facing one of said protective substrates, electrode holes are disposed in said first protective substrate, said electrode holes being through-holes formed in said first protective substrate at positions corresponding to said connection electrodes, said integrated circuit is connected to said first protective substrate in which said electrode holes are formed, and electrical connections disposed on said integrated circuit are inserted to said electrode holes and electrically connected with said connection electrodes of said sensor unit.

2. The electrostatic capacity-type acceleration sensor according to claim 1, wherein said integrated circuit and connection electrodes are connected by bonding with lead wire.

3. The electrostatic capacity-type acceleration sensor according to claim 1, wherein bumps are disposed at positions corresponding to each of said electrode holes in the surface of said integrated circuit, each of said electrode holes is filled with a conductive material, and each of said bumps is electrically connected to said conductive material in a corresponding electrode hole.

4. The electrostatic capacity-type acceleration sensor according to claim 1, wherein lead wires are bonded to said integrated circuit at positions corresponding to each of said electrode holes, each of said electrode holes is filled with a conductive material, and each of the bonded lead wires is electrically connected to said conductive material in a corresponding electrode hole.

5. An electrostatic capacity-type acceleration sensor according to claim 4, wherein each of the bonded lead wires is cut to a length less than the thickness of said first protective substrate in which said electrode holes are formed, inserted to the corresponding electrode hole, and electrically connected by fusing with said conductive material.

6. The electrostatic capacity-type acceleration sensor according to claim 1, wherein said integrated circuit is bonded to said first protective substrate in which said electrode holes are formed using a low stress resin.

7. The electrostatic capacity-type acceleration sensor according to claim 1, wherein one of said connection electrodes of said sensor unit is grounded through said integrated circuit so that capacity is stabilized and an electrostatic shield is formed.

8. An acceleration detector comprising:
- a first substrate having an upper surface, a lower surface and a plurality of electrode holes therethrough;
- a sensor unit disposed on the lower surface of said first substrate, said sensor unit including a displaceable electrode and at least one fixed electrode, displacement of said displaceable electrode with respect to said fixed electrode resulting in a change in electrostatic capacitance of the sensor unit; and
- a detection circuit disposed on the upper surface of said first substrate for detecting acceleration from the change in electrostatic capacitance of the sensor unit, said detection circuit electrically connected to said sensor unit by an electrical connection established through at least one of the plurality of electrode holes.

9. The acceleration detector according to claim 8, wherein said electrical connection includes a connection electrode disposed on said at least one fixed electrode and a lead wire connecting said connection electrode and said detection circuit through one of the plurality of electrode holes.

10. The acceleration detector according to claim 8, wherein said electrical connection includes a connection electrode disposed on said at least one fixed electrode, a conductive bump disposed on said detection circuit, and a conductive material filling one of the plurality of electrode holes to establish contact between said connection electrode and said conductive bump through the filled electrode hole.

11. The acceleration detector according to claim 8, wherein said electrical connection includes a connection electrode disposed on said at least one fixed electrode, a lead wire bonded to said detection circuit, and a conductive material filling at least one of said plurality of electrode holes to establish contact between said connection electrode and said lead wire through the filled electrode hole.

12. The acceleration detector according to claim 11, wherein said lead wire has a length less than a thickness of said first substrate.

13. The acceleration detector according to claim 8, wherein said first substrate is bonded to said detection circuit by an adhesive material.

14. The acceleration detector according to claim 9, wherein said first substrate is bonded to said detection circuit by an adhesive material.

15. The acceleration detector according to claim 10, wherein said first substrate is bonded to said detection circuit by an adhesive material.

16. The acceleration detector according to claim 11, wherein said first substrate is bonded to said detection circuit by an adhesive material.

* * * * *